(12) United States Patent
Bynum et al.

(10) Patent No.: US 7,570,486 B2
(45) Date of Patent: Aug. 4, 2009

(54) BACKPLANE SECURING DEVICE FOR AN INFORMATION HANDLING SYSTEM

(75) Inventors: Shannon Bynum, Pflugerville, TX (US); Salvador Jimenez, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 399 days.

(21) Appl. No.: 11/410,393

(22) Filed: Apr. 25, 2006

(65) Prior Publication Data
US 2007/0247825 A1 Oct. 25, 2007

(51) Int. Cl.
*G06F 1/16* (2006.01)

(52) U.S. Cl. .................................... 361/685

(58) Field of Classification Search ................. 361/680, 361/683, 685, 788
See application file for complete search history.

(56) References Cited

U.S. PATENT DOCUMENTS

| | | | |
|---|---|---|---|
| 5,652,697 A | 7/1997 | Le | |
| 6,906,914 B2 * | 6/2005 | Stamos et al. | 361/683 |
| 6,970,347 B2 | 11/2005 | Schlesener et al. | |
| 6,995,982 B2 | 2/2006 | Gonzalez et al. | |
| 2005/0157464 A1 * | 7/2005 | McAlister | 361/685 |

* cited by examiner

*Primary Examiner*—Javaid Nasri
(74) *Attorney, Agent, or Firm*—Haynes and Boone, LLP

(57) ABSTRACT

A backplane securing apparatus includes a chassis defining an information handling system housing ('IHS'). A first member is moveably coupled to the chassis, whereby the first member is operable to move along a first direction. A second member defines a rear portion of the IHS housing and is moveably coupled to the first member, whereby the second member is operable to move along a second direction in response to the first member moving along the first direction. A backplane may be coupled to the chassis using the second member, and an IHS may then be coupled to the backplane.

6 Claims, 13 Drawing Sheets

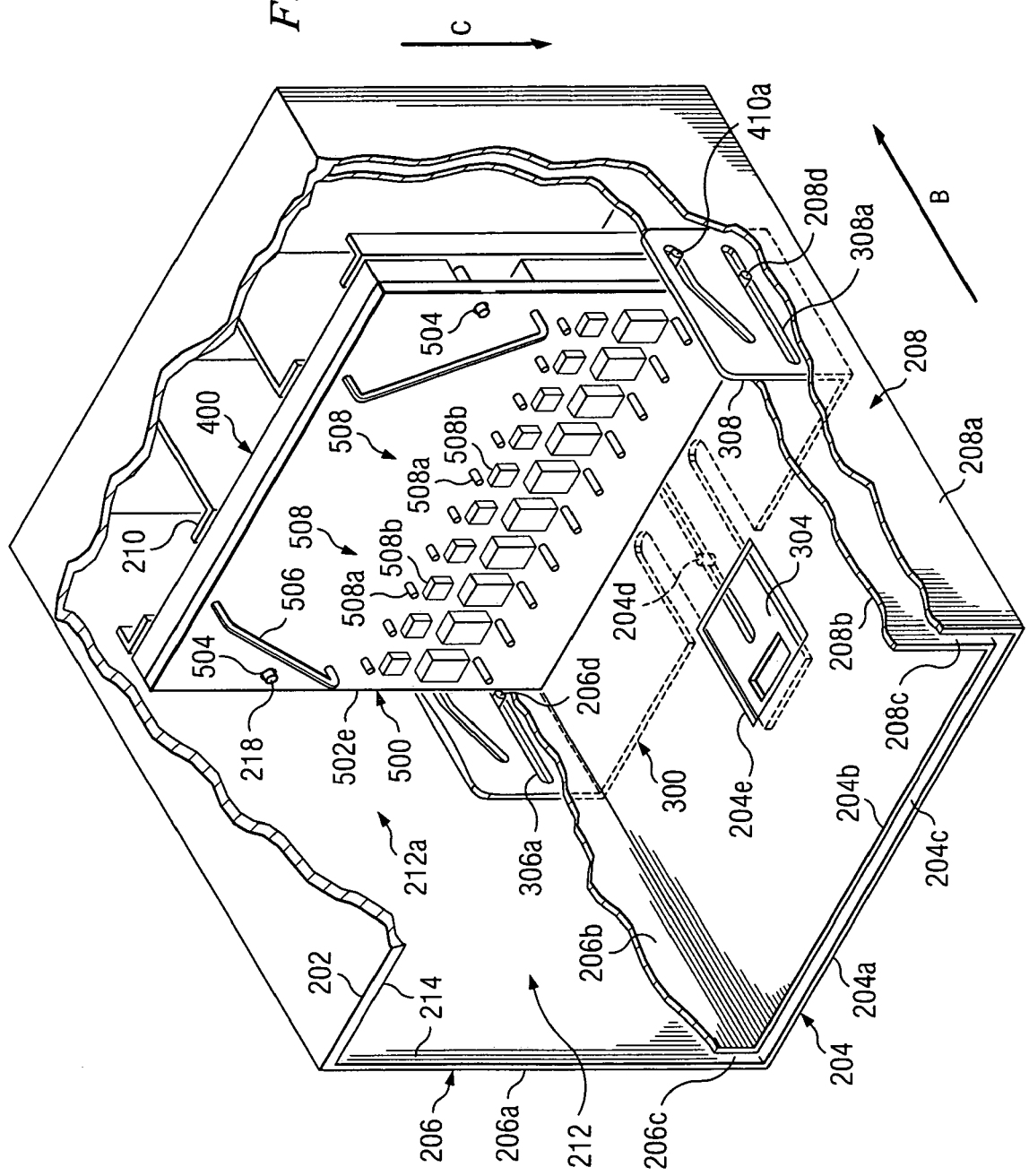

BACKPLANE SECURING DEVICE FOR AN INFORMATION HANDLING SYSTEM

BACKGROUND

The present disclosure relates generally to information handling systems, and more particularly to securing a backplane to an information handling system chassis.

As the value and use of information continues to increase, individuals and businesses seek additional ways to process and store information. One option is an information handling system ('IHS'). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Some IHSs include a chassis for housing a plurality of IHSs such as, for example, a blade server chassis for housing a plurality of blade IHSs. These chassis typically include a backplane secured in the chassis for coupling the blade IHSs to the chassis. The securing of the backplane to the chassis raises a number of issues.

The backplane is typically secured in the chassis by moving the backplane through a front entrance of the chassis and into an IHS housing defined by the chassis and then securing the backplane to the chassis in the IHS housing. Securing of a backplane to a chassis is typically accomplished by using screws, hooks, plungers, and other conventional securing devices in order to couple the backplane to the chassis.

However, as the backplane is required to be secured deeper into the IHS housing, the use of conventional securing devices become problematic, as the ability to manipulate the backplane to engage the conventional securing devices becomes limited. Furthermore, as the size of the backplane grows such that it extends across the height and width of the IHS housing, the ability to manipulate the backplane in more than one direction becomes limited, which causes problems as most conventional securing devices require that the backplane be manipulated in at least two directions in order to allow the backplane to be secured to the conventional securing device.

Accordingly, it would be desirable to provide for securing a backplane to a chassis absent disadvantages, some of which have been discussed above.

SUMMARY

According to one embodiment, a backplane securing apparatus includes a chassis defining an IHS housing, a first member moveably coupled to the chassis, whereby the first member is operable to move along a first direction, and a second member defining a rear portion of the IHS housing and moveably coupled to the first member, whereby the second member is operable to move along a second direction in response to the first member moving along the first direction.

BRIEF DESCRIPTION OF THE DRAWINGS

FIG. 4b is a rear perspective view illustrating an embodiment of the securing member of FIG. 4a.

FIG. 5b is a rear perspective view illustrating an embodiment of the backplane of FIG. 5a.

FIG. 6c is a perspective view illustrating an embodiment of the backplane of FIGS. 5a and 5b being coupled to the backplane coupling apparatus of FIG. 4c.

DETAILED DESCRIPTION

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a network server or storage device, a switch router or other network communication device, or any other suitable device and may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communications between the various hardware components.

Figure 1:
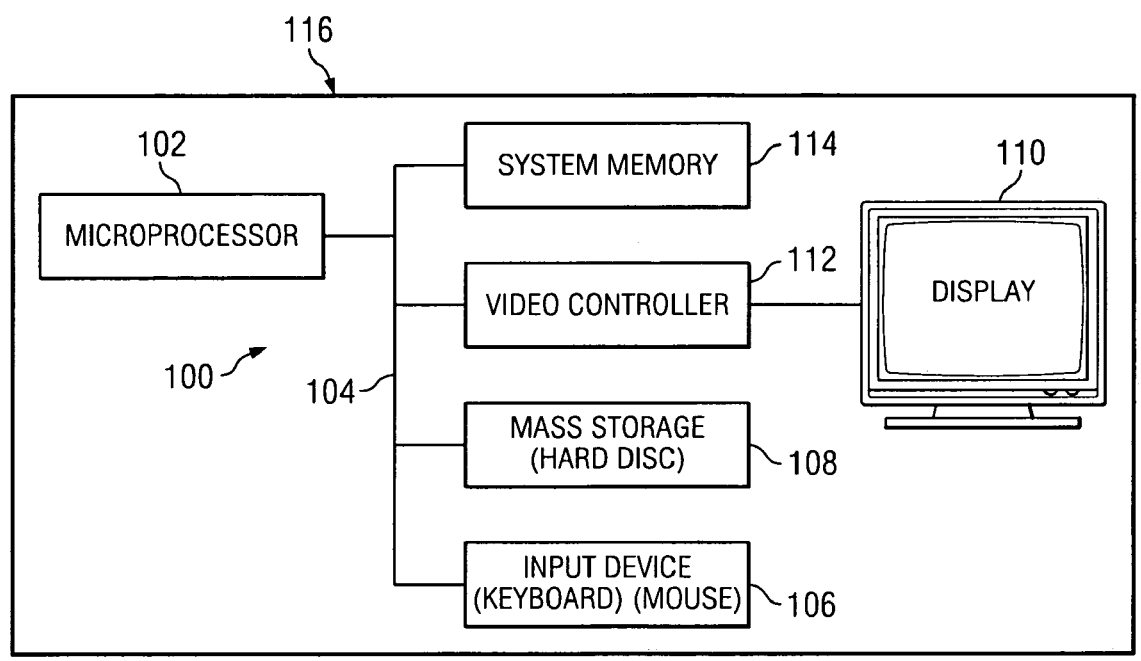
FIG. 1 is a schematic view illustrating an embodiment of an IHS.

In one embodiment, IHS 100, FIG. 1, includes a microprocessor 102, which is connected to a bus 104. Bus 104 serves as a connection between microprocessor 102 and other components of computer system 100. An input device 106 is coupled to microprocessor 102 to provide input to microprocessor 102. Examples of input devices include keyboards, touchscreens, and pointing devices such as mouses, trackballs and trackpads. Programs and data are stored on a mass storage device 108, which is coupled to microprocessor 102. Mass storage devices include such devices as hard disks, optical disks, magneto-optical drives, floppy drives and the like. IHS 100 further includes a display 110, which is coupled to microprocessor 102 by a video controller 112. A system memory 114 is coupled to microprocessor 102 to provide the microprocessor with fast storage to facilitate execution of computer programs by microprocessor 102. In an embodiment, a chassis 116 houses some or all of the components of IHS 100. It should be understood that other buses and intermediate circuits can be deployed between the components described above and microprocessor 102 to facilitate interconnection between the components and the microprocessor.

Figure 2:
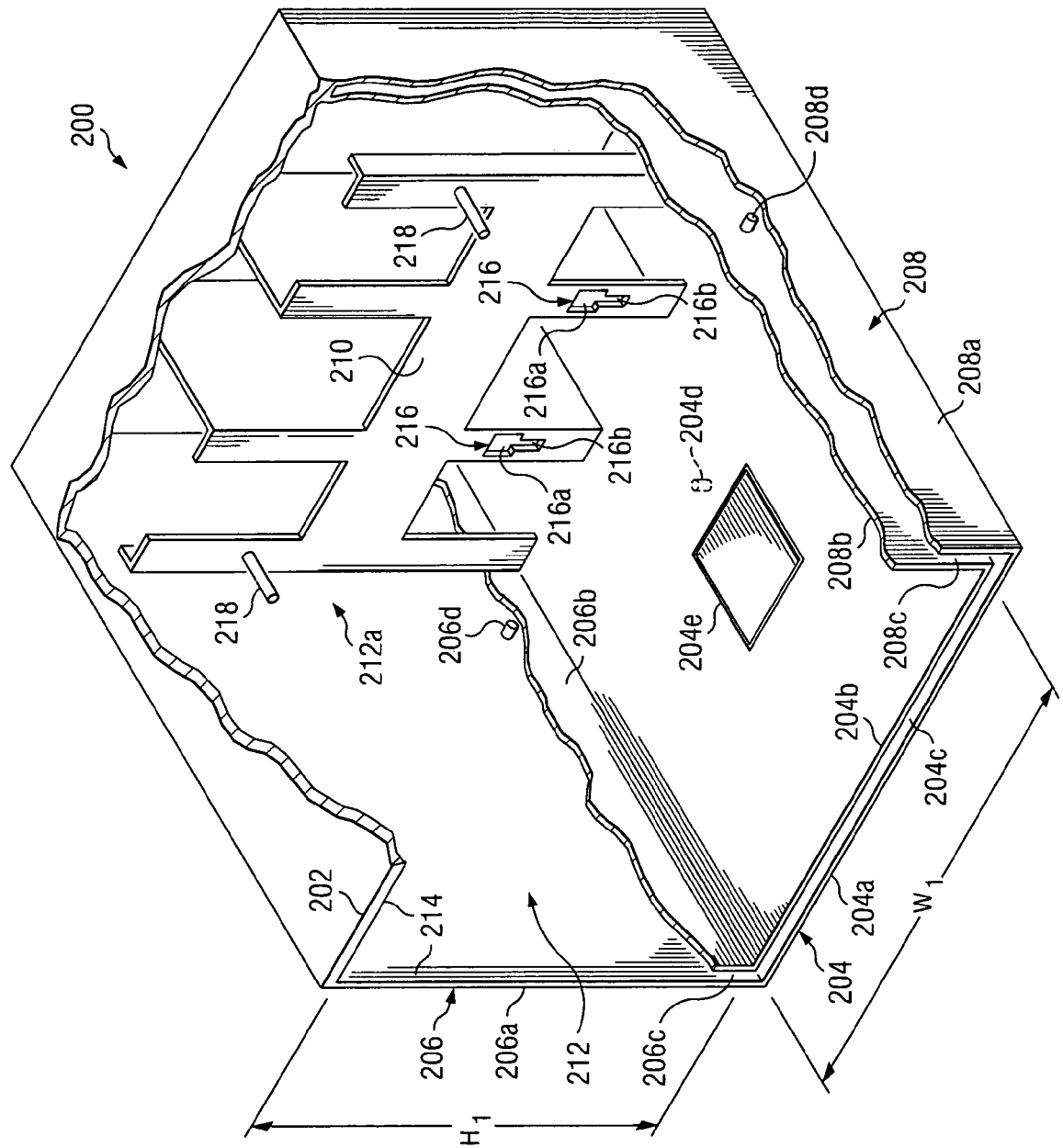
FIG. 2 is a cut-away perspective view illustrating an embodiment of a chassis.

Referring now to FIG. 2, a chassis 200 is illustrated. In an embodiment, the chassis 200 may be, for example, the chassis 116, described above with reference to FIG. 1. In an embodiment, the chassis 200 may be, for example, a blade server. The chassis 200 includes a top wall 202, a bottom wall 204 located opposite the top wall 202, and a pair of opposing side walls 206 and 208 extending between the top wall 202 and the bottom wall 204. The bottom wall 204 includes a pair of bottom wall members 204a and 204b which are located in a spaced apart orientation from each other such that they define an activation member housing 204c between them. An activation member guide 204d extends from the bottom wall member 204b and into the activation member housing 204c. An activation member access window 204e is defined by the bottom wall member 204b, is located adjacent the activation member guide 204d, and provides access to the activation member housing 204c. The side wall 206 includes a pair of side wall members 206a and 206b which are located in a spaced apart orientation from each other such that they define an activation member housing 206c between them. An activation member guide 206d extends from the side wall member 206b and into the activation member housing 206c. The side wall 208 includes a pair of side wall members 208a and 208b which are located in a spaced apart orientation from each other such that they define an activation member housing 208c between them. An activation member guide 208d extends from the side wall member 208b and into the activation member housing 208c. A securing member support 210 extends between the top wall 202, the bottom wall 204, and the side walls 206 and 208.

The top wall 202, the bottom wall 204, the side walls 206 and 208, and the securing member support 210 define an IHS housing 212 between them, and an IHS housing entrance 214 is defined between the top wall 202, the bottom wall 204, and the side walls 206 and 208 and provides access to the IHS housing 212. The IHS housing 212 and the IHS housing entrance 214 include a height $H_1$ measured from the bottom wall 204 to the top wall 202 and a width $W_1$ measured from the side wall 206 to the side wall 208. A rear portion 212a of the IHS housing 212 is defined by the securing member support 210 and located immediately adjacent the securing member support 210. The securing member support 210 also defines a plurality of securing member coupling channels 216, each securing member coupling channel 216 having an entrance aperture 216a and a movement channel 216b located immediately adjacent the entrance aperture 216a. A plurality of guide members 218 extend from opposing sides of the securing member support 210 into the rear portion 212a of the IHS housing 212 and are located adjacent the side walls 206 and 208.

Figure 3A:
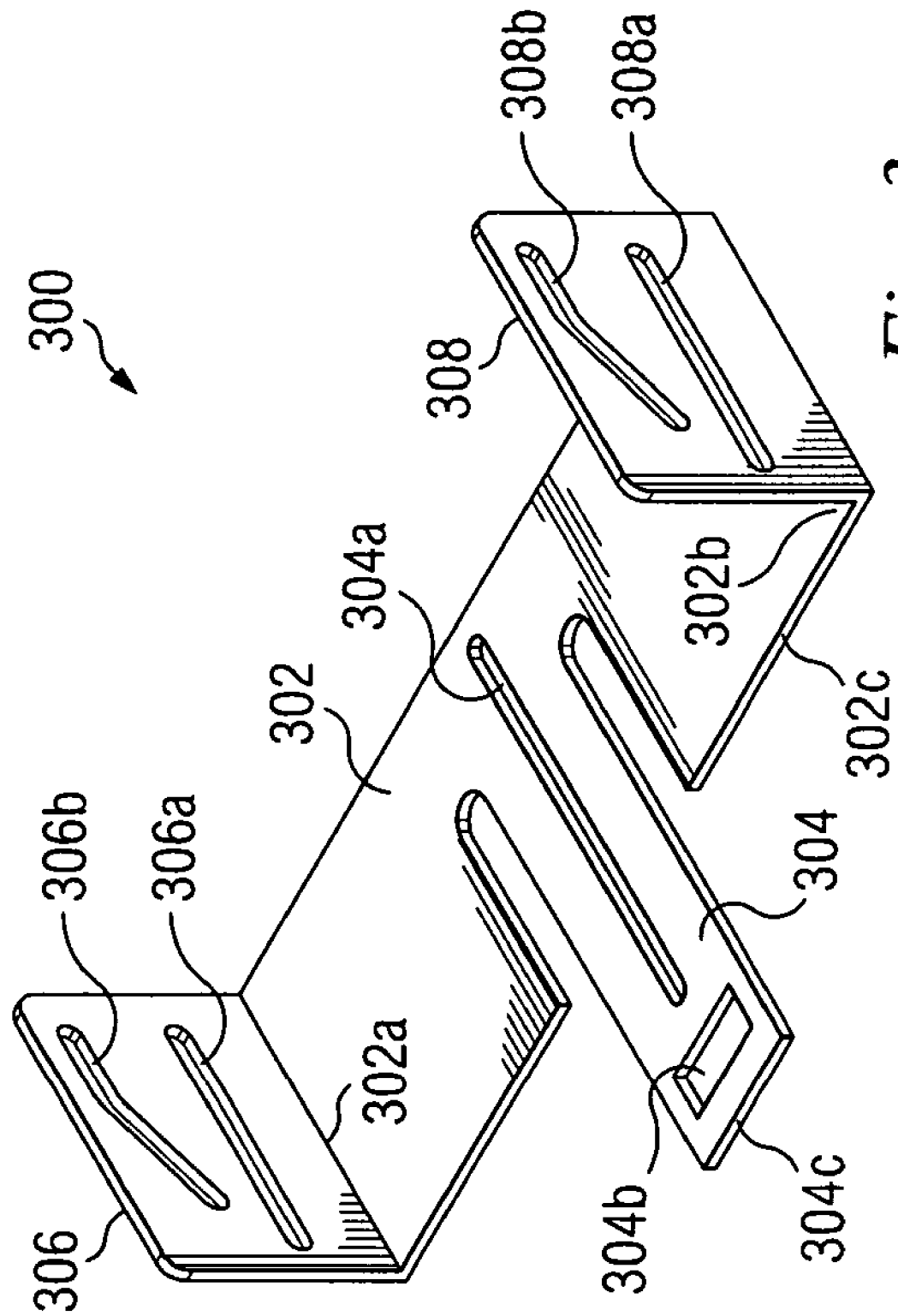
FIG. 3a is a perspective view illustrating an embodiment of an activation member used with the chassis of FIG. 2.

Referring now to FIG. 3a, an activation member 300 is illustrated. The activation member 300 includes an elongated base 302 having a pair of opposing ends 302a and 302b and a side 302c extending between the ends 302a and 302b. An activation member handle 304 is centrally located on the base 302 and extends from the base 302 and past the side 302c of the base 302. The activation member handle 304 and the base 302 define a chassis coupling slot 304a which is centrally located on the base 302 and along a length of the activation member handle 304. An activation member handle grip aperture 304b is defined by the activation member handle 304 and is located adjacent a distal end 304c of the activation member handle 304. An activation member arm 306 extends substantially perpendicularly to the base 302 from the distal end 302a of the base 302. The activation member arm 306 defines a chassis coupling slot 306a that is located along a length of the activation member arm 306. The activation member arm 306 also defines a securing member coupling slot 306b which includes a portion which is oriented substantially diagonally relative to the chassis coupling slot 306a. An activation member arm 308 extends substantially perpendicularly to the base 302 from the distal end 302b of the base 302. The activation member arm 308 defines a chassis coupling slot 308a that is located along a length of the activation member arm 308. The activation member arm 308 also defines a securing member coupling slot 308b which includes a portion which is oriented substantially diagonally relative to the chassis coupling slot 308a.

Figure 3B:
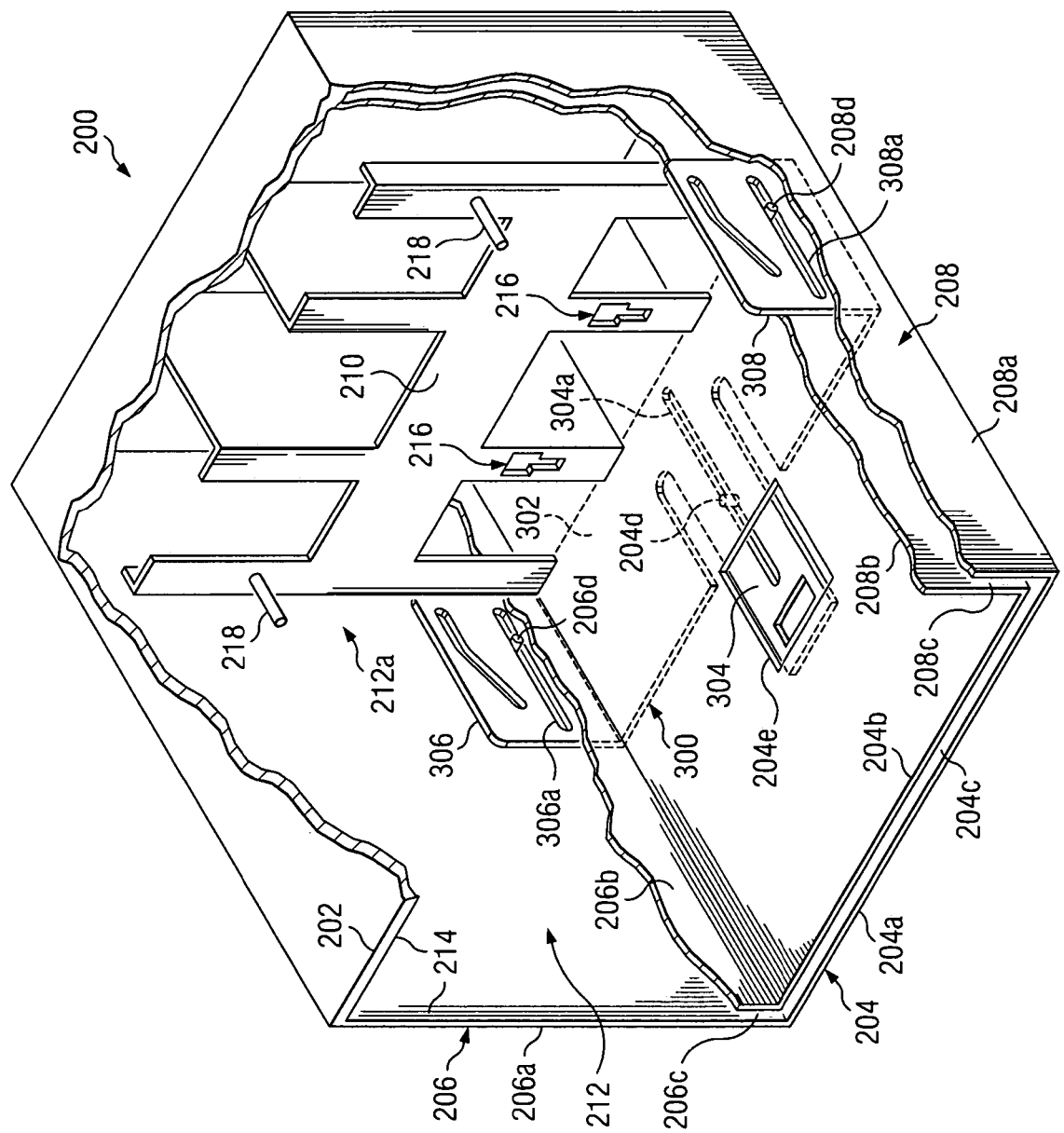
FIG. 3b is a cut-away perspective view illustrating an embodiment of the activation member of FIG. 3a located in the chassis of FIG. 2.

Referring now to FIGS. 3a and 3b, the activation member 300 is located in the chassis 200 such that the elongated base 302 is located in the actuation member housing 204c defined by the bottom wall 204 between the bottom wall member 204a and the bottom wall member 204b, the activation member arm 306 is located in the activation member housing 206c defined by the side wall 206 between the side wall member 206a and the side wall member 206b, and the activation member arm 308 is located in the activation member housing 208c defined by the side wall 208 between the side wall member 208a and the side wall member 208b. Furthermore, the activation guide member 204d is located in the chassis coupling slot 304a, the activation guide member 206d is located in the chassis coupling slot 306a, and the activation guide member 208d is located in the chassis coupling slot 308a, moveably coupling the activation member 300 to the chassis 200, as illustrated in FIG. 3b. With the activation member 300 coupled to the chassis 200, the activation member handle grip aperture 304b on the activation member handle 304 is located immediately adjacent the activation member access window 204e.

Figure 4A:
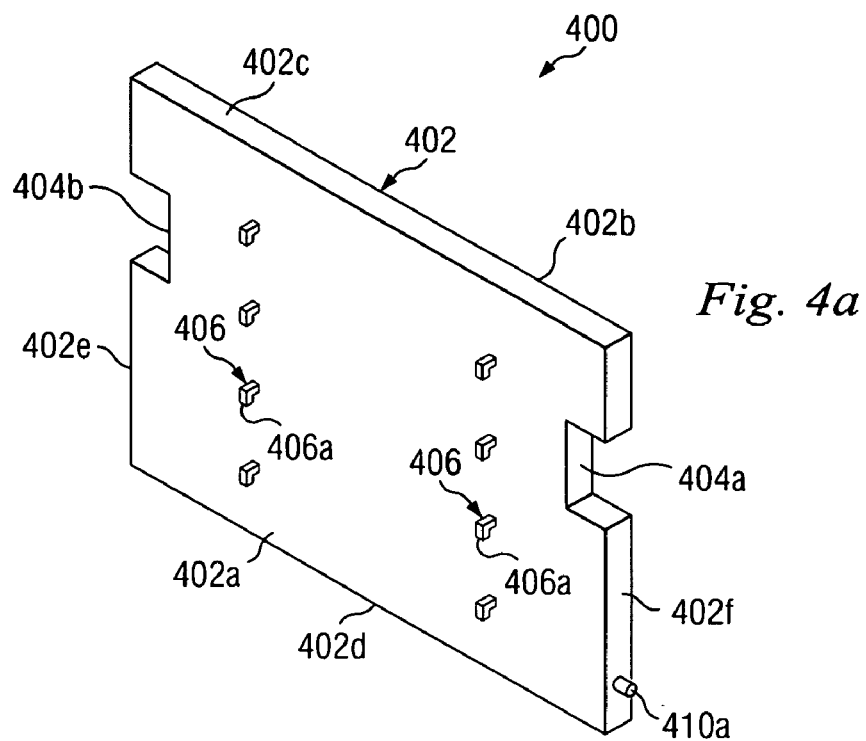
FIG. 4a is a front perspective view illustrating an embodiment of a securing member used with the chassis of FIG. 2 and the activation member of FIGS. 3a and 3b.
Figure 4B:
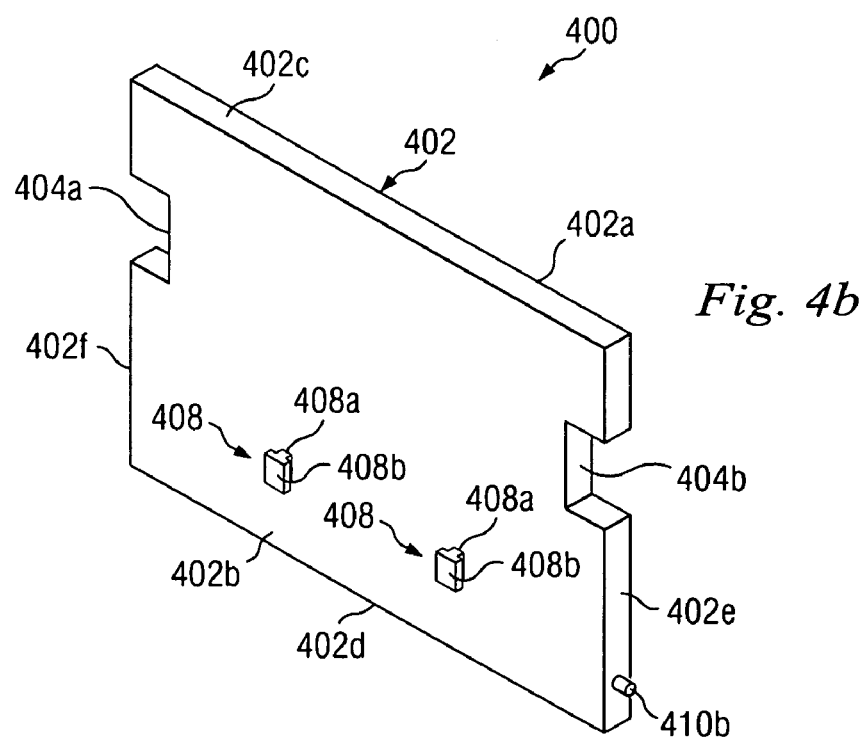

Referring now to FIGS. 4a and 4b, a securing member 400 is illustrated. The securing member 400 includes a base 402 having a front surface 402a, a rear surface 402b located opposite the front surface 402a, a top surface 402c extending between the front surface 402a and the rear surface 402b, a bottom surface 402d located opposite the top surface 402c and extending between the front surface 402a and the rear surface 402b, and a pair of opposing side surfaces 402e and 402f extending between the front surface 402a, the rear surface 402b, the top surface 402c and the bottom surface 402d.

A guide member channel 404a is defined by the base 402 and is located on the side surface 402f and adjacent the top surface 402c. A guide member channel 404b is defined by the base 402 and is located on the side surface 402e and adjacent the top surface 402c and opposite the guide member channel 404a. A plurality of securing devices 406 extend from the front surface 402a of the securing member 400 in a spaced apart orientation from each other, each securing device 406 including a hook member 406a on its respective distal end. A plurality of chassis coupling members 408 extend from the rear surface 402b of the securing member 400, are located adjacent the bottom surface 402d in a spaced apart orientation from each other, and each include a beam 408a with a head member 408b on the distal end of the beam 408a. An activation coupling member 410a extends from the side surface 402f and is located adjacent the bottom surface 402d. An activation coupling member 410b extends from the side surface 402e and is located adjacent the bottom surface 402d.

Figure 4C:
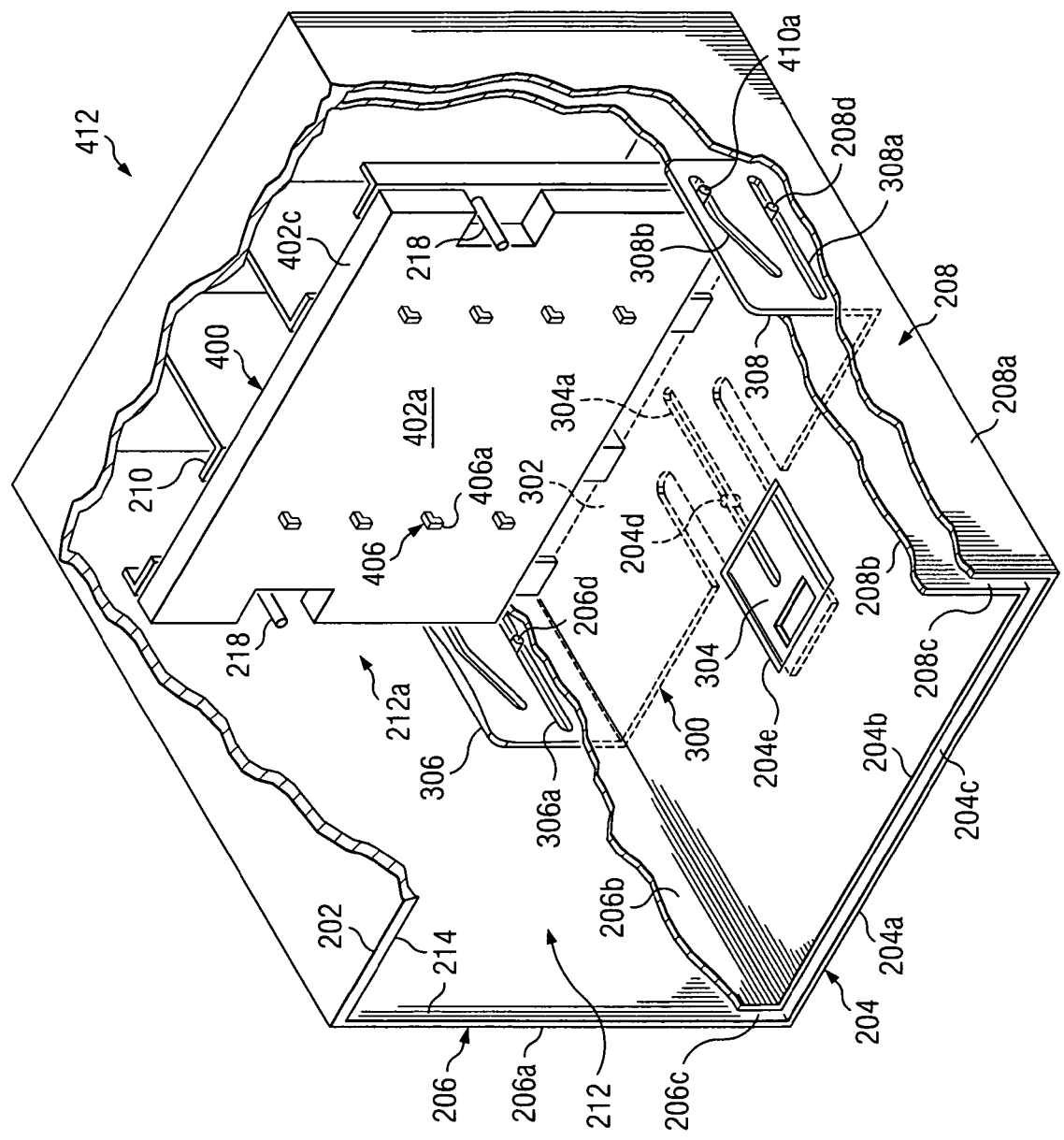
FIG. 4c is a cut-away perspective view illustrating an embodiment of the securing member of FIGS. 4a and 4b located in the chassis of FIG. 3b, providing a backplane coupling apparatus.
Figure 4D:
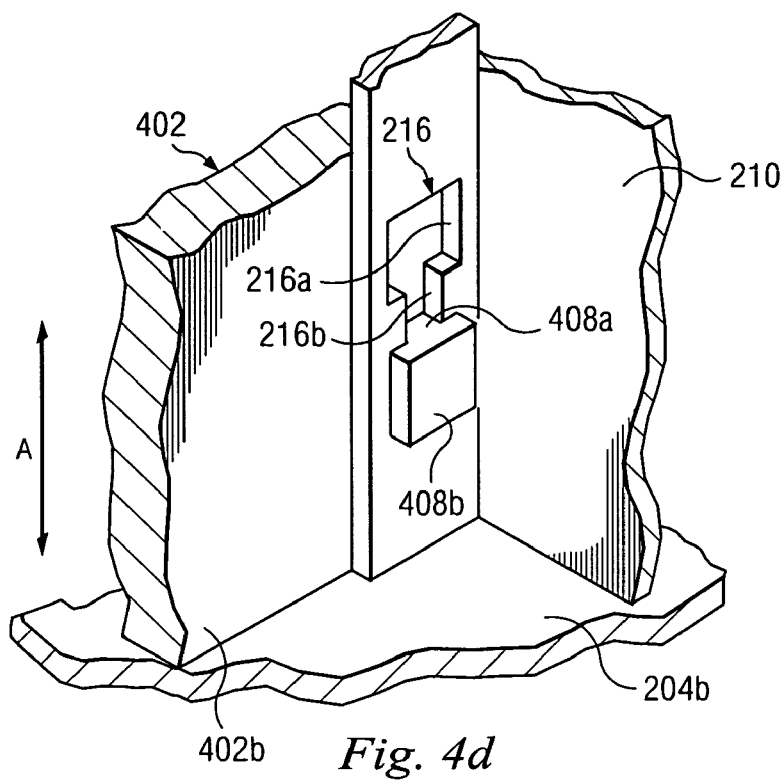
FIG. 4d is a perspective view illustrating an embodiment of the coupling of the securing member of FIGS. 4a and 4b and the chassis of FIG. 3b.

Referring now to FIGS. 4a, 4b, 4c and 4d, the securing member 400 is located in the chassis 200 such that the activation coupling member 410a on the side surface 402f of the securing member 400 is located in the securing member coupling slot 308b and the activation member 410b on the side surface 402e of the securing member 400 is located in the securing member coupling slot 306b (not shown). Furthermore, the chassis coupling members 408 on the rear surface 402b of the securing member 400 engage the securing member support 210 on the chassis 200 by positioning the chassis coupling members 408 in the securing member coupling channels 216 such that the beams 408a are located in the movement channels 216b, as illustrated in FIG. 4d, coupling the securing member 400 to the chassis 200. With the chassis coupling members 408 in the securing member coupling channels 216, the securing member 400 is allowed to move along a direction A by sliding the beam 408a through the movement channel 216b. Furthermore, with the securing member 400 coupled to the chassis 200, the guide members 218 are located in the guide member channels 404a and 404b. With the activation member 300 and the securing member 400 coupled to the chassis 200, as illustrated in FIG. 4c, a backplane securing apparatus 412 is provided.

Figure 5A:
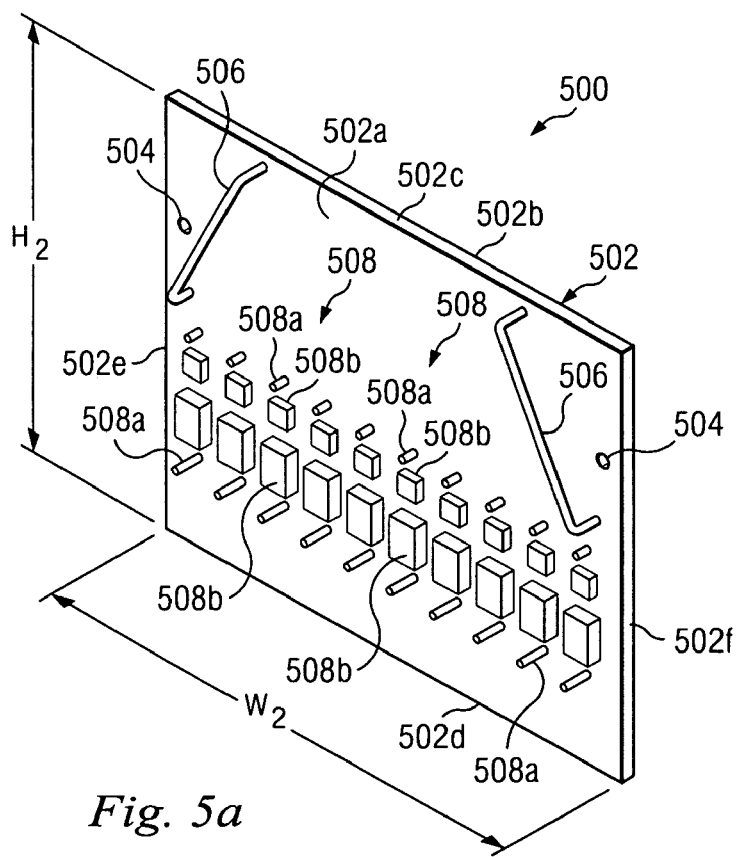
FIG. 5a is a front perspective view illustrating an embodiment of a backplane used with the backplane coupling apparatus of FIG. 4c.
Figure 5B:
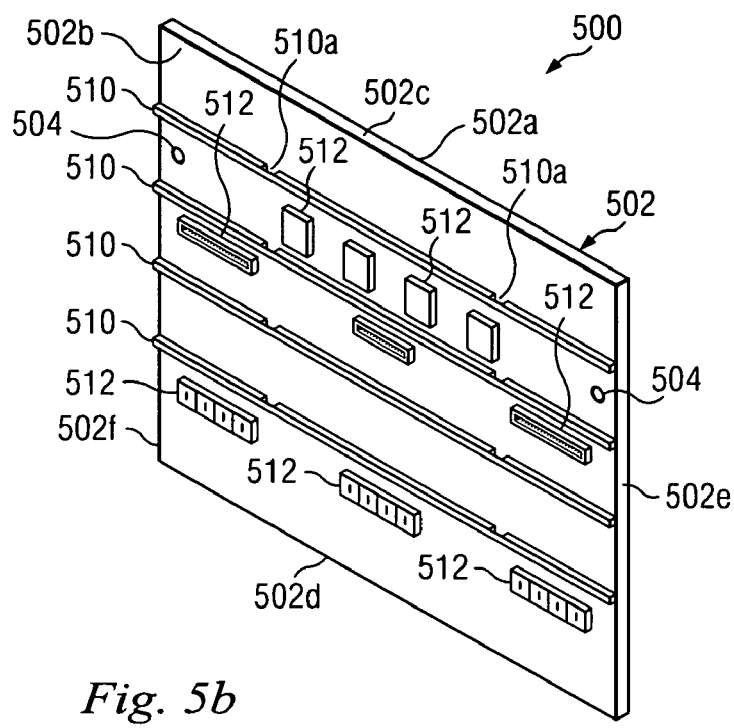

Referring now to FIGS. 5a and 5b, a backplane 500 is illustrated. The backplane includes a base 502 having a front surface 502a, a rear surface 502b located opposite the front surface 502a, a top surface 502c extending between the front surface 502a and the rear surface 502b, a bottom surface 502d located opposite the top surface 502c and extending between the front surface 502a and the rear surface 502b, and a pair of opposing side surface 502e and 502f extending between the front surface 502a, the rear surface 502b, the top surface 502c, and the bottom surface 502d. The backplane 500 includes a height $H_2$ measured from the bottom surface 502d to the top surface 502c and a width $W_2$ measured from the side wall 502e to the side wall 502f. A plurality of guide member apertures 504 are defined by the base 502, extend through the base 502 from the front surface 502a to the rear surface 502b, and are located adjacent the sides 502e and 502f. A pair of backplane handles 506 extend from the front surface 502a of the backplane 500 and are located adjacent the top surface 502c. A plurality of IHS couplers 508 are located on the front surface 502a in a side-by-side orientation, each IHS coupler 508 including a plurality of guide pins 508a and a plurality of electrical couplers 508b. A plurality of securing member coupling beams 510 are located along the width $W_2$ of the rear surface 502b in a substantially spaced-apart, parallel orientation, each securing member coupling beam 510 including a plurality of securing device coupling apertures 510a. A plurality of electrical couplers 512 are located on the rear surface 502b.

Figure 6A:
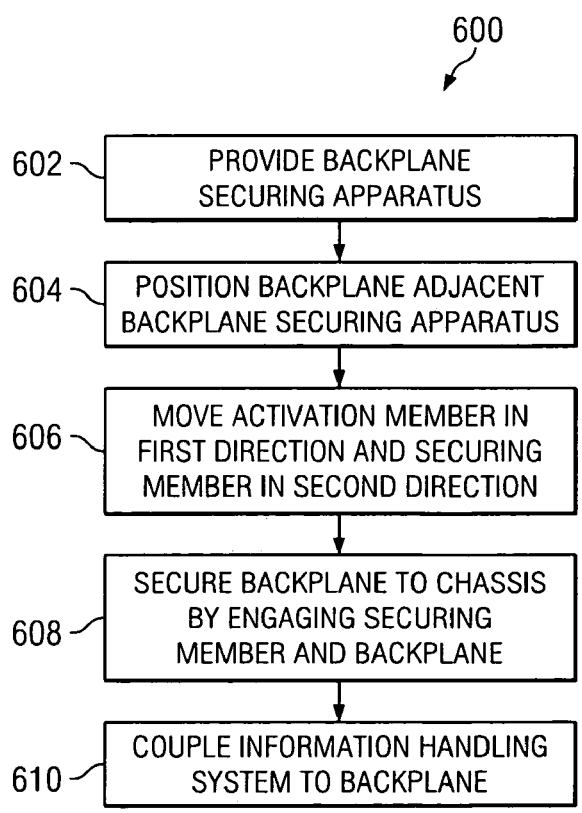
FIG. 6a is a flow chart illustrating an embodiment of a method for securing a backplane to a chassis.
Figure 6B:
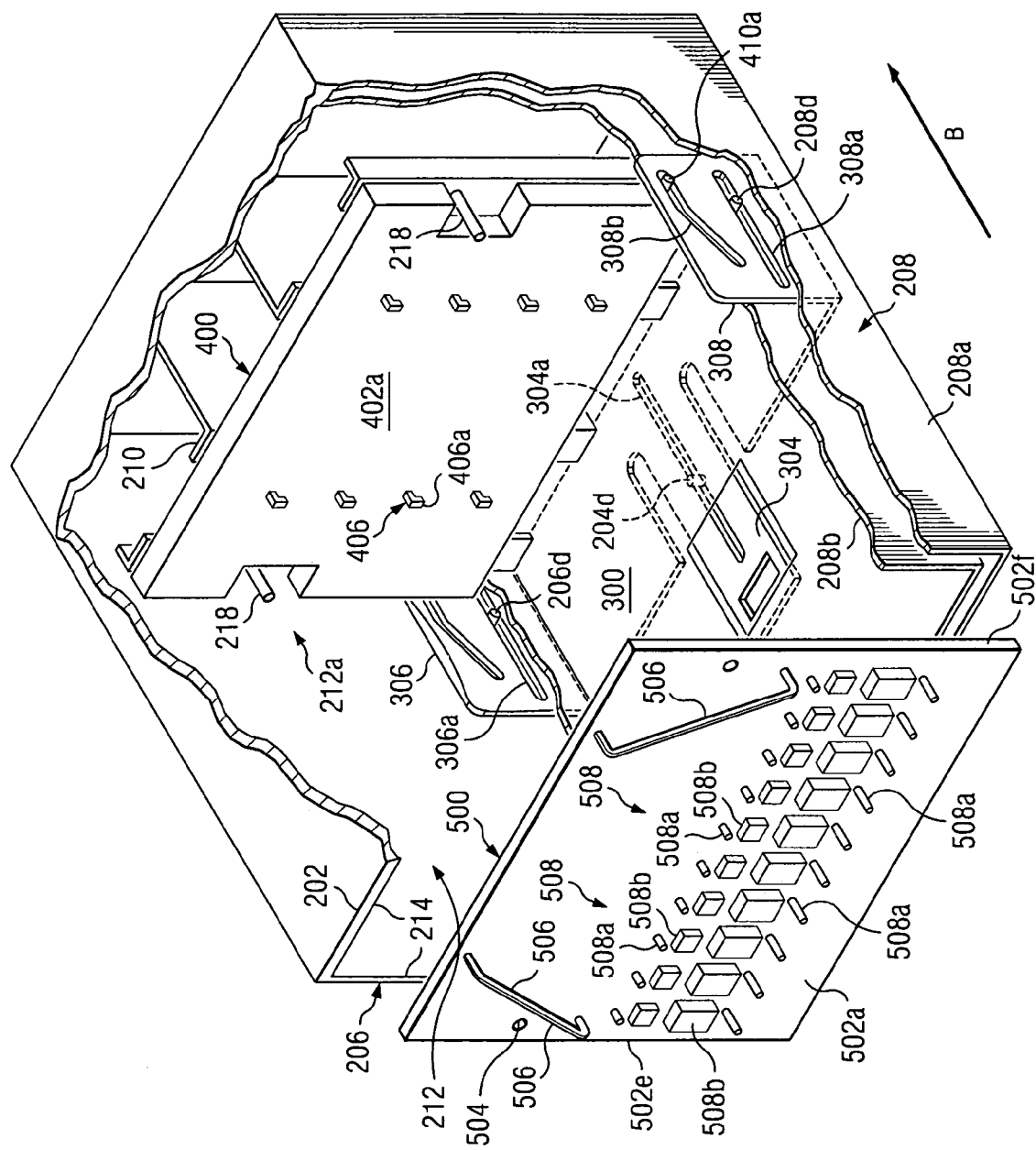
FIG. 6b is a perspective view illustrating an embodiment of the backplane of FIGS. 5a and 5b being coupled to the backplane coupling apparatus of FIG. 4c.
Figure 6D:
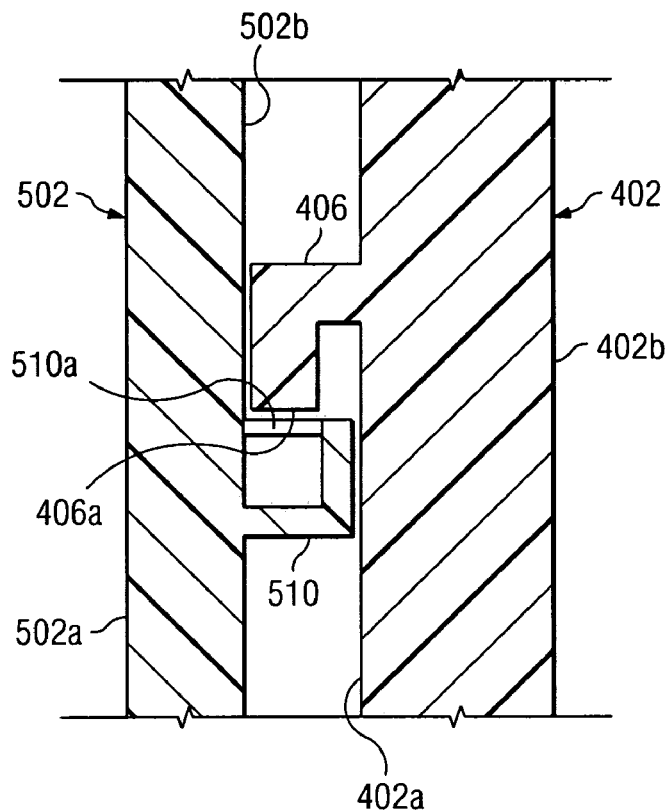
FIG. 6d is a perspective view illustrating an embodiment of the backplane of FIGS. 5a and 5b being coupled to the backplane coupling apparatus of FIG. 4c.

Referring now to FIGS. 4c, 5a, 5b, 6a, 6b, 6c, and 6d, a method 600 for securing a backplane to a chassis is illustrated. The method 600 begins at step 602 where the backplane securing apparatus 412, illustrated in FIG. 4c, is provided. The method 600 then proceeds to step 604 where the backplane 500, illustrated in FIGS. 5a and 5b, is positioned adjacent the securing member 400 on the backplane securing apparatus 412. The backplane 500 is positioned adjacent the chassis 200 such that the rear surface 502b on the backplane 500 is immediately adjacent the IHS housing entrance 214, as illustrated in FIG. 6b. The backplane 500 is then moved in a direction B such that the backplane 500 enters the IHS housing 212 through IHS entrance 214 and becomes positioned immediately adjacent the securing member 400, as illustrated in FIG. 6c. In an embodiment, the height $H_2$ of the backplane 500 is substantially equal to the height $H_1$ of the IHS housing 212 and the width $W_2$ of the backplane 500 is substantially equal to the width $W_1$ of the IHS housing 212 such that, once the backplane 500 is located in the IHS housing 212, the backplane 500 can only be moved in the direction B due to the backplane 500 motion being restrained by the top wall 202 of the chassis 200, the bottom wall 204 of the chassis 200, and the side walls 206 and 208 of the chassis 200. In an embodiment, with the backplane 500 in IHS housing 212, a space is provided between the top wall 202 on the chassis 200 and the top surface 502c on the chassis 500 to allow airflow over the backplane 500, and the movement of the backplane 500 is restrained by the engagement of the guide member 218 and the guide member apertures 504. With the backplane 500 positioned immediately adjacent the securing member 400, each of the hook members 406a on the securing devices 406 on securing member 400 are positioned adjacent the securing device coupling apertures 510a on securing member coupling beams 510, as illustrated in FIG. 6d.

Figure 6F:
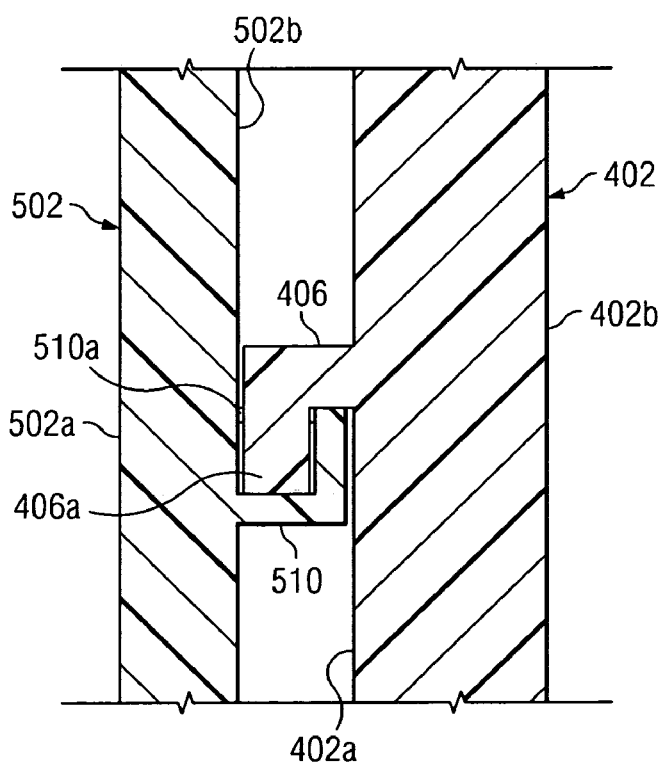
FIG. 6f is a perspective view illustrating an embodiment of the backplane of FIGS. 5a and 5b coupled to the backplane coupling apparatus of FIG. 4c.
Figure 6E:
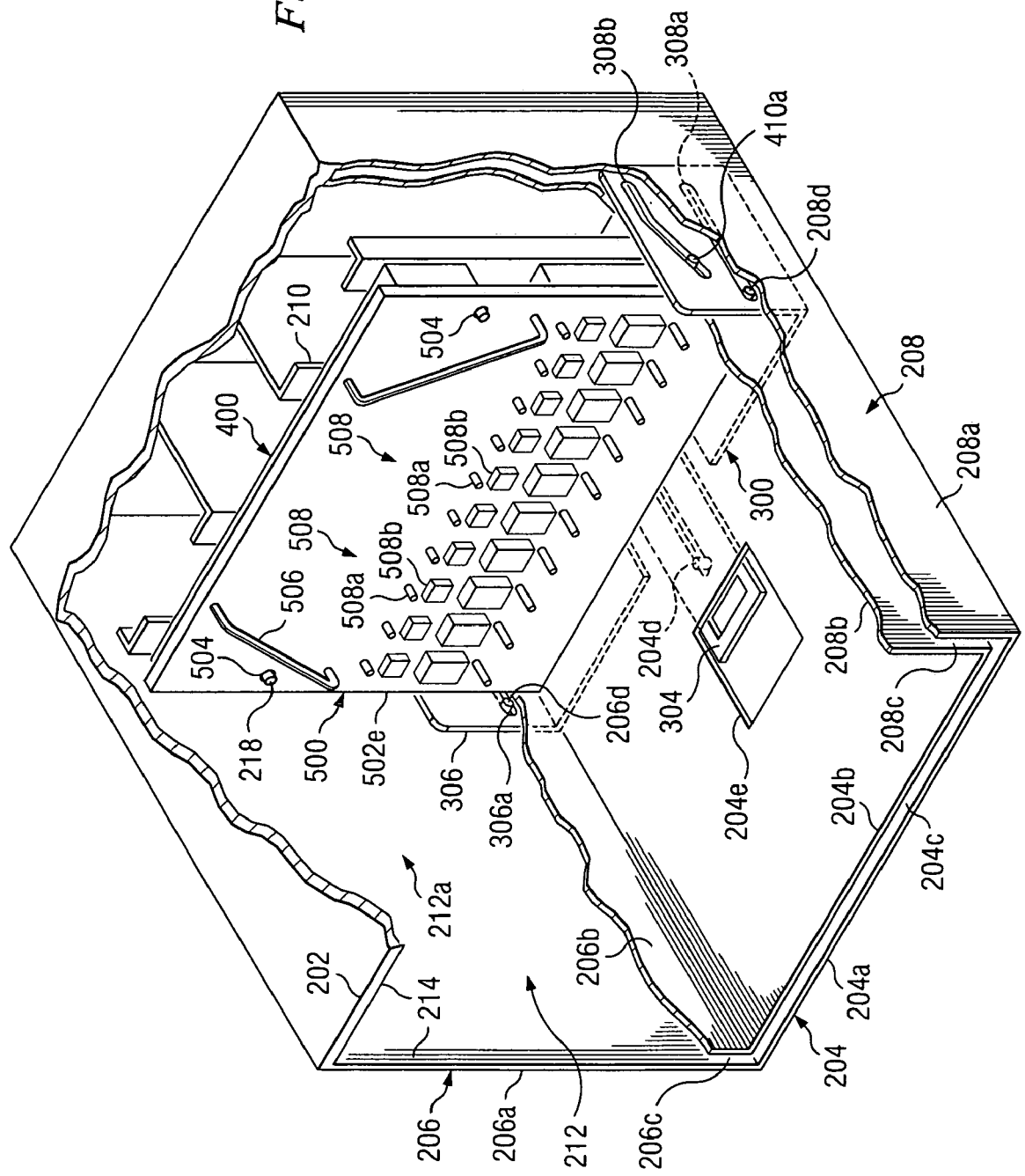
FIG. 6e is a perspective view illustrating an embodiment of the backplane of FIGS. 5a and 5b coupled to the backplane coupling apparatus of FIG. 4c.
Figure 6G:
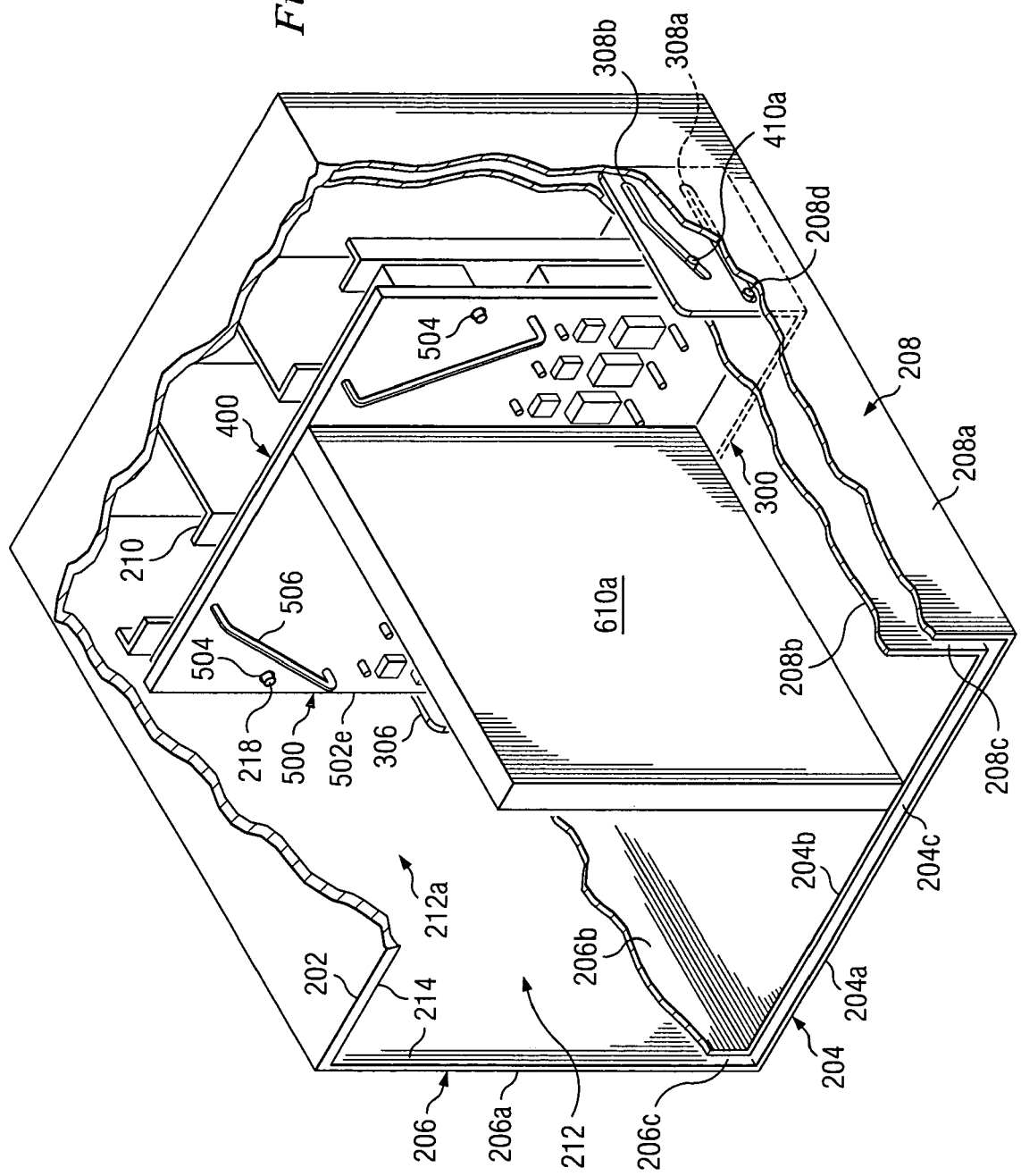
FIG. 6g is a perspective view illustrating an embodiment of an IHS coupled to the backplane and backplane coupling apparatus FIG. 6e.

Referring now to FIGS. 6a, 6c, 6e, and 6f, the method 600 proceeds to step 606 where the activation member 300 is moved in a first direction and the securing member is moved in a second direction. The activation member 300 is moved in the first direction B by engaging the activation member handle grip aperture 304b on activation member handle 304 through the activation member access window 204e. The activation member 300 is allowed to move relative to the chassis 200 due to the coupling of the activation member guides 204d, 206d, and 208d with the chassis coupling slots 304a, 306a, and 308a, respectively. As the activation member 300 moves in the first direction B, the securing member 400 is moved in a second direction C due to the engagement of the activation coupling members 410a and 410b and the securing member coupling slots 308b and 306b, respectively. As the securing member 400 moves in the direction $C_x$, the method 600 proceeds to step 608 where the backplane is secured to the chassis by engaging the securing member 400 with the backplane 500. Moving the securing member 400 in the direction C in step 606 results in the hook members 406a on the securing devices 406 on securing member 400 becoming positioned in the securing device coupling apertures 510a on securing member coupling beams 510 and engaging the backplane 500, securing the backplane 500 to the chassis 200, as illustrated in FIG. 6f. The method 600 then proceeds to step 610 where an IHS is coupled to the backplane 500. An IHS 610a is provided which may be, for example, the IHS 100 described above with reference to FIG. 1. In an embodiment, the IHS 610a may be, for example, a blade, a hard disk drive, or a variety of other IHSs known in the art. The IHS 610a is then positioned in the IHS housing 212 and coupled to the backplane 500 through the IHS coupler 508 using the plurality of guide pins 508a and the plurality of electrical couplers 508b, as illustrated in FIG. 6g.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An IHS, comprising:
   a chassis defining an IHS housing;
   an activation member moveably coupled to the chassis and including a first and second coupling slot, whereby the activation member is operable to move along a first direction defined by the first coupling slot;
   a securing member defining a rear portion of the IHS housing and moveably coupled to the activation member, whereby the securing member is operable to move along a second direction defined by the second coupling slot in response to the activation member moving along the first direction;
   first means for coupling the securing member to the chassis;
   a backplane located in the IHS housing and secured to the chassis through the engagement of the securing member and the backplane;
   second means for coupling the backplane to the securing member; and
   an IHS coupled to the backplane.

2. The system of claim 1, wherein the activation member is located between a pair of walls on the chassis, whereby the chassis defines an activation member access window located adjacent the IHS housing for accessing the activation member.

3. The system of claim 1, wherein the first coupling means includes a plurality of securing devices extending from a first side of the securing member and into engagement with the chassis.

4. The system of claim 1, wherein the second coupling means includes a plurality of securing devices extending from a second side of the securing member and into engagement with the backplane.

5. The system of claim 1, wherein the chassis comprises a blade server and the IHS comprises a blade.

6. The system of claim 1, wherein
   a plurality of IHSs are operable to be coupled to the backplane.

* * * * *